United States Patent [19]
Jacobs

[11] Patent Number: 6,052,319
[45] Date of Patent: Apr. 18, 2000

[54] APPARATUS AND METHOD FOR CONTROLLING EXPERIMENTAL INVENTORY

[75] Inventor: Marc A. Jacobs, San Mateo, Calif.

[73] Assignee: Cypress Semiconductor Corp., San Jose, Calif.

[21] Appl. No.: 08/984,722

[22] Filed: Dec. 4, 1997

[51] Int. Cl.$^7$ .................................................. G11C 29/00
[52] U.S. Cl. ................... 365/201; 365/103; 365/185.09; 324/765
[58] Field of Search .................................... 365/201, 103, 365/185.09; 324/765; 371/21.1, 22.1

[56] References Cited

U.S. PATENT DOCUMENTS

| | | | |
|---|---|---|---|
| 4,510,673 | 4/1985 | Shils et al. ................................. | 29/574 |
| 4,931,997 | 6/1990 | Mitsubishi et al. ...................... | 365/218 |
| 5,084,843 | 1/1992 | Mitsubishi et al. ...................... | 365/218 |
| 5,256,578 | 10/1993 | Corley et al. ............................... | 437/8 |
| 5,360,747 | 11/1994 | Larson et al. ............................... | 437/8 |
| 5,406,566 | 4/1995 | Obara ..................................... | 371/21.2 |
| 5,457,408 | 10/1995 | Leung ..................................... | 326/38 |
| 5,642,307 | 6/1997 | Jernigan .................................. | 365/103 |
| 5,664,093 | 9/1997 | Barnett et al. ....................... | 395/183.07 |
| 5,867,714 | 2/1999 | Todd et al. ............................... | 395/712 |
| 5,892,683 | 4/1999 | Sung ....................................... | 364/488 |
| 5,905,887 | 5/1999 | Wu et al. ................................. | 395/555 |
| 5,917,833 | 6/1999 | Sato ....................................... | 371/21.1 |

Primary Examiner—Tan T. Nguyen
Attorney, Agent, or Firm—Kevin L. Daffer; Conley, Rose & Tayon

[57] ABSTRACT

An integrated circuit, apparatus, and a method is provided for programming and reading manufacturing information upon non-volatile storage elements of the integrated circuit. The manufacturing information includes the particular processing recipe and layout of the integrated circuit, each recipe or layout indicative of a specific hardware revision. The storage elements may be programmed prior to assembling the integrated circuit within a semiconductor package, and the programmed elements are read prior to shipping the packaged integrated circuit to a customer. If the read hardware revision is not qualified for release, the product will be placed in a staging area and prevented from shipping to a customer or end user. Thus, the programmed hardware revision serves to gate product at test before shipping that product to a customer. The manufacturing information is programmed by the manufacturer and is inaccessible by a customer since the address space which contains product engineering bits is known only to the manufacturer.

18 Claims, 3 Drawing Sheets

APPARATUS AND METHOD FOR CONTROLLING EXPERIMENTAL INVENTORY

BACKGROUND OF THE INVENTION

1. Field of the Invention

This invention relates to integrated circuit manufacture and, more particularly, to an apparatus and method for identifying and preventing improper shipment of integrated circuits from the circuit manufacturer to a customer or user.

2. Description of the Related Art

An integrated circuit is often referred to as a die or chip. Those terms are henceforth interchangeably used. A die may contain several thousand active and passive devices formed on a monolithic substrate. Those devices can be interconnected to form an overall circuit. Active devices include transistors, whereas passive devices include resistors and capacitors, for example.

Active and passive devices are formed and interconnected across the substrate using numerous fabrication steps, materials and equipment. To achieve precise placement of features which form an integrated circuit, a carefully carried out sequence of processing steps (e.g., deposition, etch, lithography, implant and/or heat cycles must be followed). Any deviation from the pre-set fabrication "recipe" will modify characteristics of the resulting product. In addition, any changes whatsoever to equipment used to implement the various steps will also modify the resulting product. For example, an ion implant concentration and/or energy from a specific ion implanter may be desired over other concentrations, energies or implanters. For this reason, many fabrication processes require specific types of equipment used to perform the various processing steps.

In addition to tracking the sequence and equipment used during the fabrication sequence, there may also be a desire to promote a particular arrangement of features which form the various active and passive devices. In this instance, the features are produced according to what is often called a "layout". There may be numerous layout arrangements used for a specific integrated circuit depending upon the number of revisions that must be undertaken to achieve optimal performance, or performance which is more suitable to a specific application. As the layout changes, the various masks which form the integrated circuit also change. Typically, the revision number on each mask is imprinted on the resulting integrated circuit. The imprint is usually placed in a non-functional region of the integrated circuit and can be visually detected. Unfortunately, once the integrated circuit is removed from the wafer and encapsulated in a package, the revision number of the layout can no longer be discerned.

It would be desirable to track not only the particular processing recipe but also the layout revision, both of which are generically referred to henceforth as the manufacturing or "hardware" revision. It is intended that hardware revision encompass one or more, or a grouping of select parameters (e.g., processing steps, processing equipment, processing materials and/or layouts, etc.) used in forming active and passive devices on an integrated circuit. The tracking mechanism must be one which can detect a hardware revision attributable to an integrated circuit after the integrated circuit is removed from the wafer, placed in a package and possibly shipped to a customer. The mechanism of tracking hardware revisions after the integrated circuit leaves the manufacturing site proves beneficial, for example, in determining why or how the integrated circuit failed in the field.

Hardware revisions (i.e., revision to the processing recipe, processing equipment, or layout) used to produce a dissimilar version of integrated circuit product, are generally needed in order to perform changes to the final hardware product or possibly to experiment with changes to the product. Experimental results may help identify possible future enhancements to the hardware product.

Experimental wafer lot runs are often referred to as non-qualification lots used by product engineers to ascertain, for example, possible causes of yield loss. By performing experiments on one or more wafers or one or more wafer lots, the product engineer can gather information useful in improving the integrated circuit performance or yield. Periodic experiments prove useful but only if packaged integrated circuits formed from those experiments are not inadvertently shipped to a customer. While a non-qualification wafer lot may pass final tests procedures, it may nonetheless be prudent not to ship integrated circuits derived from that lot. For example, if the experimental wafers demonstrate reliability problems, then the shipped integrated circuits may, over time, fail. It is not until the non-qualified wafers are qualified is it desirable to release that product to a customer. For this reason, it would be beneficial to not only track each and every hardware revision used to produce all the various parameters which involve integrated circuit manufacture, but also to prevent shipping non-qualified hardware revisions to a customer.

In addition to tracking hardware revisions, it may also be desirable to track software revisions. For example, many integrated circuits employ one or more memory elements arranged across the die. A popular memory device is one which can be electrically programmed after the die is manufactured, or possibly shipped to the customer. Once the storage elements are programmed, they are preferably non-volatile. Present non-volatile storage elements include, for example, programmable read only memory ("PROM"), fuses and/or anti-fuses, etc. Examples of popular PROMs include EPROMs, EEPROMs, or flash memory. The memory elements upon the die may be programmed either by the manufacturer or in the field. It may be important to keep track of the particular version of software used to program the memory elements since compatibility of that program version to a particular hardware revision used in forming the integrated circuit is important.

If an integrated circuit involves non-volatile memory elements then, in many instances, a customer will program the memory elements in the field using a software program revision which may or may not be compatible with the hardware revision shipped from the manufacturer. If the integrated circuit fails in its intended purpose, the customer or manufacturer will generally not know if the problem rests with the hardware or the manner in which the non-volatile storage elements were programmed. Typically, however, a manufacturer will know that a particular hardware revision is compatible with specific software revisions which, in most instances, are supplied directly or indirectly to the customer from the manufacturer. Thus, if a new hardware revision is released to the customer, then changes may be needed to the software program to form a new software revision compatible with that hardware. It is for this reason that it would be desirable to know if the hardware revision matches the software revision. More importantly, it would be desirable to read both the hardware and software revisions either at the customer or manufacturer site, possibly during program of the non-volatile memory. If, for example, the hardware and software revisions do not match, the customer can return the product to the manufacturer and receive updated hardware or software. The benefit of knowing a particular hardware revision and whether that revision is qualified for release to a customer would therefore prove an important benefit to the manufacturer along with knowing the particular software revision used in programming the integrated circuit at the customer site.

SUMMARY OF THE INVENTION

The problems outlined above are in large part solved by an electrically programmable integrated circuit, die or chip. Formed on a portion of the integrated circuit is a non-volatile storage location containing one or more storage elements. Certain storage elements may be programmed solely by the manufacturer preferably while the integrated circuit remains a part of a semiconductor wafer. A unique set of product engineering ("PE") bits are programmed by the manufacturer into those storage elements within an address space which the customer or end user will not access during normal operation of the integrated circuit.

The PE bits contain information as to a particular hardware revision used to produce the integrated circuit embodying the storage elements. The PE bits are addressed preferably during tests of die within a wafer. Viability of the die may be tested at the same time at which the PE bits are programmed. Thus, the PE bits can be programmed as early as wafer engineering tests immediately subsequent to wafer manufacture, or as late as partial, functional and parametric tests performed immediately prior to scribing the wafer and removing viable die for assembly.

Each die across the wafer contains PE bits programmed with a specific hardware revision used to produce that wafer. The PE bits therefore contain parameters used in manufacturing that wafer or possibly numerous wafers within a wafer lot. Thus, a hardware revision is stored as PE bits within the storage elements reserved for those bits.

The stored hardware revision number can either be one which is qualified or non-qualified. If qualified for release to a customer, a final test operation post-assembly will ascertain this fact and allow all qualified integrated circuits to be shipped. However, if the revision number indicates a non-qualified (e.g., experimental) revision number indicative of an experiment used in forming that integrated circuit, then the assembled integrated circuit will be held in storage or scrapped. Not until the non-qualified revision is updated to a qualified revision will that integrated circuit containing programmed, non-qualified PE bits ship to a customer.

The PE bits and, specifically, the storage elements dedicated to receive the PE bits, prove important in ensuring that non-qualified product does not ship to a customer. Programming occurs prior to wafer scribe so that traceability to a particular manufactured wafer can be achieved. Reading the programmed PE bit locations occurs at various test stages and certainly during final tests. The tester reads the programmed PE bits from the integrated circuits and compares those bits against a benchmark bit sequence. If the programmed PE bits differ from the benchmark bits, then the tester will indicate the integrated circuit is to be sent to a particular bin and not shipped to a customer.

Broadly speaking, the present invention concerns an integrated circuit. The integrated circuit comprises a non-volatile storage element formed in an address location reserved for receiving information as to whether the integrated circuit is suitable for shipment from the integrated circuit manufacturer. The address location is deemed inaccessible during normal operation of the integrated circuit, and the information received by the storage element comprises indicia as to a hardware revision of that integrated circuit. The storage element preferably receives the information or indicia as a PE bit prior to assembling the integrated circuit in a package. The packaged integrated circuit is prevented from shipment if tests performed prior to shipment indicate the assembled integrated circuit contains PE bits indicative of a non-qualified revision.

The present invention further concerns an apparatus for programming an integrated circuit. The apparatus includes a programming mechanism adapted for writing at least one bit of information into at least one storage element on the integrated circuit. The hardware revision information is attributable to the manufacture of the integrated circuit at a time in which the integrated is traceable to a particular wafer and wafer lot. A reading mechanism is also included, and is adapted for reading the programmed information from the storage element to determine if the integrated circuit is qualified for release by the integrated circuit manufacturer.

The present invention further concerns a method for determining if an integrated circuit is suitable for release from the manufacturer. The method includes writing electronic indicia into storage locations on the integrated circuit. The indicia corresponds to parameters used in the manufacture of the integrated circuit and is generally classified as a particular hardware revision number stored within the storage location or locations. Thus, electronic indicia represents a particular hardware revision number from among possibly numerous hardware revisions that can be used to produce the integrated circuit. The written indicia (or PE bits) can be read during testing of the integrated circuit to determine if the read hardware revision indicates the integrated circuit is suitable for release from the manufacturer.

BRIEF DESCRIPTION OF THE DRAWINGS

Other objects and advantages of the invention will become apparent upon reading the following detailed description and upon reference to the accompanying drawings in which.

Figure 1:
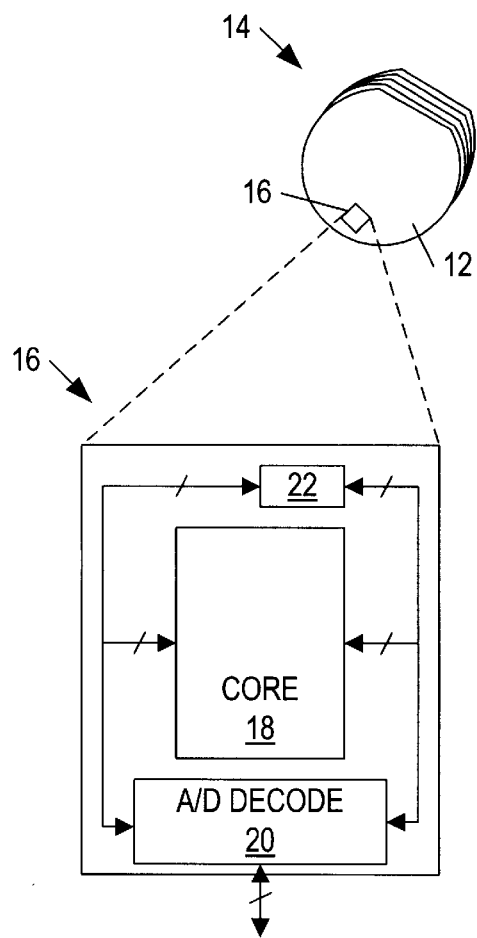
FIG. 1 is a plan view of an integrated circuit extracted from a specific wafer and wafer lot, wherein the integrated circuit is shown to contain storage locations dedicated to receiving product engineering bits arranged according to one embodiment.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates numerous wafers 12 within a wafer lot 14. An integrated circuit or die 16 may be derived from a particular location of wafer 12. Wafer lot 14 contains numerous wafers only one of which is shown as wafer 12. Integrated circuit 16 can be derived from many locations of wafer 12, or from the various other wafers within wafer lot 14. Merely as an example, integrated circuit 16 is drawn from the location shown, and is presented in a detailed, plan view as having a core section 18 and a decode unit 20.

Core section 18 may include an array of memory elements, at least some of which are non-volatile. According to one example, at least one storage element can be arranged within a storage location 22 outside core 18. Storage location 22 comprises at least one storage element and, preferably, as many storage elements as are needed to store a particular hardware revision used in producing integrated circuit 16.

An address and/or data interface 20 receives address and data information and accesses core 18 separate from storage location 22. Preferably, core 18 is accessed during normal operation of integrated circuit 16, whereas storage location 22 is inaccessible at times in which integrated circuit 16 is operating. Storage location 22 can be addressed and data placed into or from one or more PE bit locations only by the manufacturer (if hardware revisions are written) or by a programmer (if software revisions are written). The combination of hardware and software revisions helps track the particular revision history of the integrated circuit. The PE bits stored in location 22 will not be called upon or used to carry out the operation or functionality of integrated circuit 16. Thus, the user of integrated circuit 16 will generally not know that storage location 22 exists or that location 22 contains PE bits, or the function of those PE bits.

Decode unit 20 decodes a specific address of core 18 to carry out the functionality of circuit 16. Address and data buses extend between decode unit 20, core 18 and storage location 22. However, decode unit 20 addresses from an altogether dissimilar address space from that which accesses core 18 storage elements.

Figure 2:
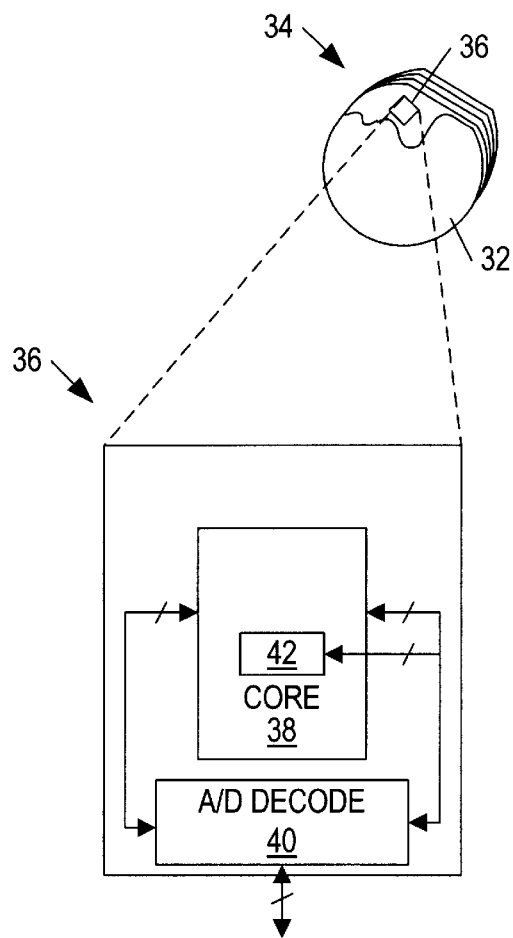
FIG. 2 is a plan view of an integrated circuit extracted from a specific wafer and wafer lot, wherein the integrated circuit is shown to contain storage locations dedicated to receiving product engineering bits arranged according to another embodiment.

FIG. 2 illustrates the possibility that integrated circuit 36 can be drawn from another wafer such as wafer 32 of wafer lot 34. Integrated circuit 36 is shown in plan view as containing a storage location 42 within core 38. Contrary to the embodiment shown in FIG. 1, storage location 42 may form a part of the array of memory elements within core 38. Regardless of whether the storage locations 22/42 are physically within the confines of the memory array or outside the memory array, or whether the integrated circuit 16/36 is drawn from a first, second, etc. wafer within a particular wafer lot, the storage location reserved for PE bits remains inaccessible during normal operations of the integrated circuit. The address/data decoder 20/40, shown according to alternative embodiments, addresses memory within the core separate from the PE bits stored within the storage locations. The number of conductors which form the address or data bus can vary depending, for example, on the number of PE bits needed to indicate the hardware or software revisions which they represent.

Figure 3:
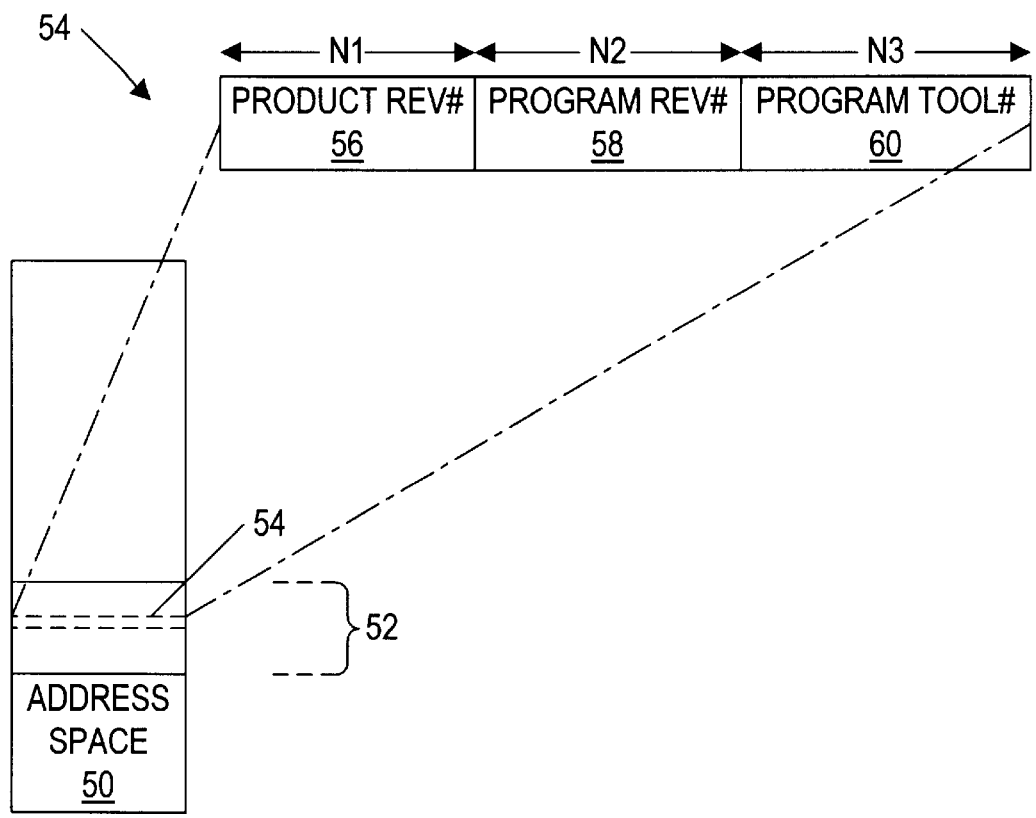
FIG. 3 is a memory address space which includes an address location reserved for receiving the product engineering bits used to identify information pertinent to the manufacture and program of the integrated circuit.

Referring to FIG. 3, some of the information which can be stored within the storage elements of location 22/42 are shown. According to one embodiment, the address decoder of FIGS. 1 and 2 can accommodate an address space 50. A majority of address space 50 is used to program operation of the integrated circuit, or other integrated circuits operably linked thereto. However, a subset 52 of address space 50 is reserved for receiving manufacturing and software programming indicia.

According to one embodiment, subset 52 can be addressed to contain any and all manufacturing data embodied upon the integrated circuit and pertinent to parameters used in manufacturing the integrated circuit. Those parameters being the hardware revision number. Subset 52 can be found as possibly a contiguous space or bifurcated into multiple address locations within address space 50. Subset address space 52 can be of fixed size for a particular integrated circuit post-manufacture, or can be variable in size depending on the number of address locations desired. For example, at least one address location 54 within space 52 may be used to uniquely identify the parameters involved in producing, e.g., revision number five of the integrated circuit. Thus, address location 54 may contain all information needed to identify a particular hardware revision of the produced integrated circuit. Manufacturing information at location 54 can be stored in a number of storage elements N1, each storage element accommodating the PE bit which indicates a unique product (or hardware) revision number 56. For example, if bits N1=8, then there are possibly $2^8$, or 256 different hardware revision numbers which can be identified at location 56. Any change whatsoever in the processing recipe, equipment and/or layout of the integrated circuit will be reflected as a specific revision number and encoded as one of the possible 256 revisions upon the integrated circuit thusly formed. Merely as an example, if the sputter tool has been modified to deposit a thicker conductive material, or thermal cycles extended, etc., then the resulting product will be identified with a unique revision number and coded with PE bits at location 56.

In addition to hardware revisions, software revisions can also be stored in subset 52. For example, numerous software programs, or slightly changed versions of the same software can program a programmable integrated circuit. For the same reasons that hardware revisions must be kept track of, software revisions must also be monitored and written into subset address space 52. For example, if address location 54 can accommodate N2 storage elements dedicated to software revisions, then a total of $2^{N2}$ possible software revisions can be stored. The same applies for the programming tool which imputes the particular software program onto the integrated circuit memory. The program tool may be manufactured by numerous vendors, each of which must be kept track of in relation to the software and hardware revisions. The storage locations dedicated to receiving N3 PE bits indicative of a programming tool is shown as reference numeral 60. The storage location reserved for receiving the PE bits containing the software revision number is shown as reference numeral 58.

Information as to a particular processing recipe or layout can be represented as a unique binary value of 1s and 0s, similar to the software revision number and the particular programming tool which is used to program the integrated circuit. All three forms of information are written to the integrated circuit storage location at specific times and then later read to determine compatibility. According to another embodiment, the hardware revision can be written and later read to determine if that particular revision is qualified for release to a customer. Therefore, depending on the application or needs of the integrated circuit manufacturer, a portion of the stored PE bits within space 52, or the entire sequence of PE bits in space 52 can be read. The number of bits needed to take into account all the potential hardware revisions, software revisions, and in-the-field programming tools can vary depending on the number of potential revisions and programming tools.

The hardware revision number 56 is written at a time dissimilar from when the software revision number 58 is written. In fact, in certain applications, the software revision number need not be written when only the hardware revision number is needed. Typically, the hardware revision number 56 is written at a time when the integrated circuit is associated with the wafer or wafer lot from which it is manufactured. In this manner, manufacturing indicia such as how, when, where, etc. the integrated circuit was manufactured can be stored before the integrated circuit is removed from the wafer of interest. Thus, since manufacturing information is generally attributed to a wafer and not an integrated circuit, the integrated circuit must receive that information when it is attributable to a wafer or wafer lot. Reading the programmed information occurs after the integrated circuit is removed from the wafer and is typically assembled into an encapsulated, packaged product. More specifically, reading the hardware information may occur before or after the packaged integrated circuit is shipped to a customer. In one example, the hardware revision number is read prior to shipment to screen non-qualified product from shipment. According to an alternative embodiment, the hardware revision number is read after shipment, along with the software revision number. The combination of hardware and software revision numbers proves beneficial in informing the manufacturer or customer of an incompatible hardware and software combination.

Figure 4:
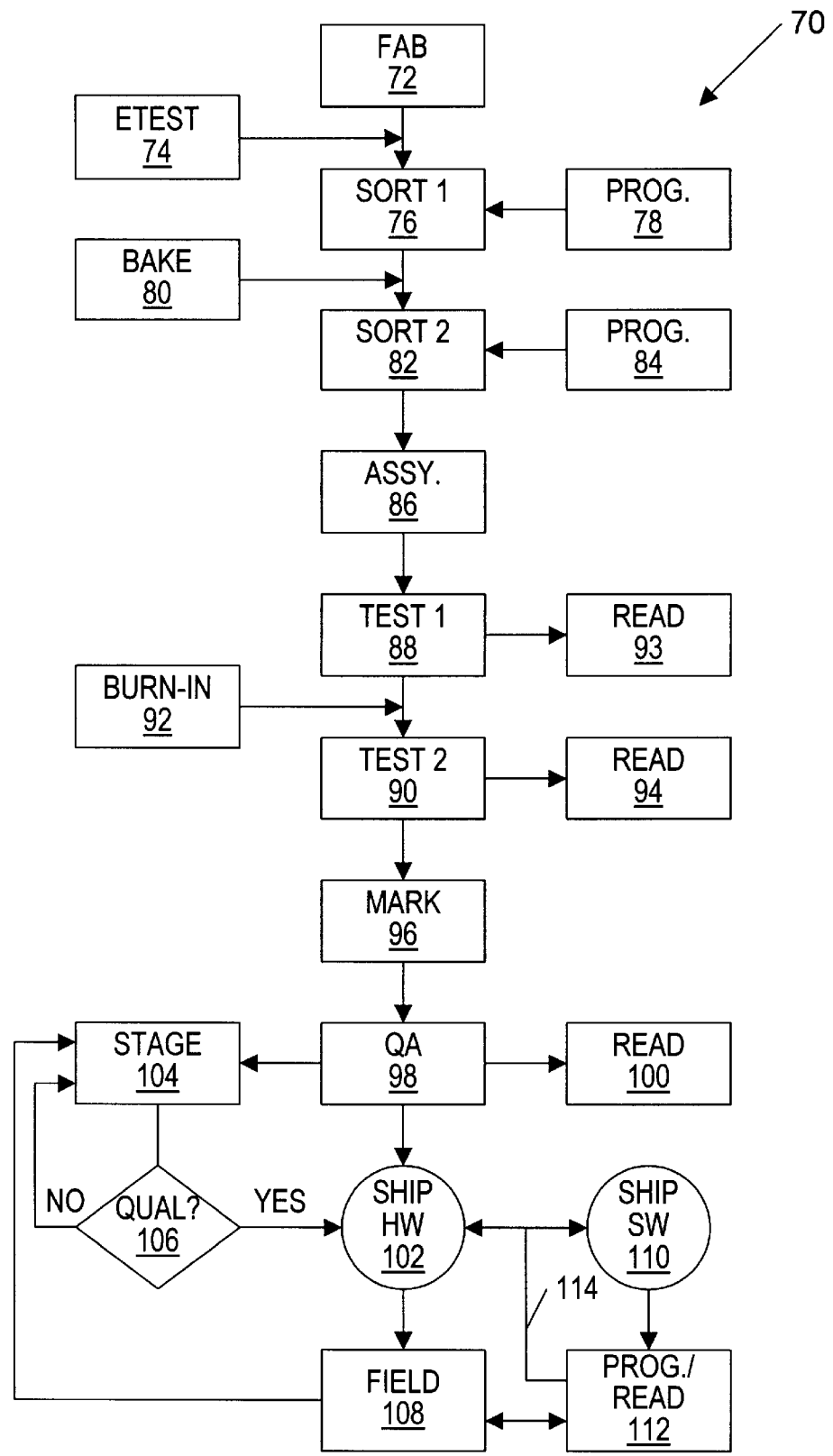
FIG. 4 is a flow diagram of operations used to manufacture, test, assemble and program the integrated circuit, to attribute information about the integrated circuit hardware being shipped, to attribute information about the software used to program the integrated circuit, and/or to determine compatibility between the shipped hardware and the program software.

Turning to FIG. 4, an example flow diagram is illustrated as to when hardware and software revision numbers can be programmed and thereafter read. Specifically, FIG. 4 illustrates a sequence of operations 70 undertaken by a manufacturer and user of an integrated circuit. Flow 70 begins by fabricating a wafer 72 containing a plurality of die, chips or integrated circuits. Engineering tests 74 can be conducted on test devices at select locations across one or more wafers within a wafer lot. Providing the engineering tests 74 roughly indicate positive results, then each die of every wafer can then be tested 76 at SORT1. SORT1 can include parametric and functional testing as well as visual inspection. Electrical testing includes probing the bond pads of each die to ascertain whether the die meets a limited number of performance points. During SORT1, storage elements within a storage location which is not called upon during normal operation may be programmed at step 78. Programming the storage location with PE bits requires accessing subset 54 of the entire address space 50 (shown in FIG. 3). Once the non-volatile memory elements are programmed, then each wafer may be subjected to a high thermal cycle, generally referred to as a bake cycle 80. Each die can thereafter be subjected to another sort test 82, referred to as SORT2. SORT2 may contain many tests which are substantially identical to those used as SORT1. Instead of programming the storage location dedicated to PE bits at step 78, programming can occur at sort2 via step 84. Alternatively, programming may occur at both steps 78 and 84, with possibly different manufacturing indicia provided at each program operation. All die which fail SORT2 tests 82 are marked with a visually-identifiable marking, such as an ink dot. Die which are electrically and visually viable are then passed to an assembly operation 86.

Assembly 86 involves placing die which pass die-probe tests (SORT1 and SORT2) into a package and then sealing that package using various well-known techniques. The connection between the bond pads upon the viable die to leads extending from the package occur during assembly operation 86.

Testing the assembled product may involve testing at various temperatures. For example, the tests may be the same as or more extensive than that used during SORT1 and SORT2. Testing can occur at different temperatures, or can be separated by a high temperature cycle often referred to as "burn-in". The post-assembly tests are shown as reference numerals 88 and 90, possibly separated by the burn-in cycle 92. The temperatures used, and the tests specified depend on customer demands. Possibly during each test, the storage locations programmed during step 78 and/or 84 can be read at steps 93 and/or 94. For example, a unique die programmed with a particular revision of hardware at step 78 can be traced to test procedure 88 and read at step 93. Any skew in the operational characteristics of that die can be monitored for the particular manufacturing revision used to produce that die. The importance in providing specific details of how, when, and where a die arises as well as how, when, and where a die is manufactured, etc. can be read after assembly or even after the die is shipped to a customer in order to correlate the read parameters back to the die under possibly numerous operating temperatures and conditions.

Once the assembled die is tested, the packaged product can then be marked with customer and/or vendor identification at step 96. Thereafter, the packaged product can be finally tested at a quality assurance step 98. Qualification test 98 may involve an additional reading of programmed or "imprinted" manufacturing indicia (i.e., hardware revision number) at step 100. That which passes the qualification test 98 can then be shipped to a customer at step 102 provided the revision number read at step 100 is a "qualified" revision. If the hardware revision number is not qualified, then tests 98 will indicate that fact and prevent the product from shipping. The non-qualified product can be placed in a staging area 104. Staging area 104 is an inventory control area at the manufacturers site, where non-qualified product is stored and categorized.

Non-qualified product includes any and all product which has not passed manufacturers scrutiny for shipment to a customer. This includes product which is manufactured as experimental wafers or wafer lots. The experimental wafers were directed by product engineers of the manufacturer and indicate modifications or changes to the manufacturing and/or layout parameters of the integrated circuit. Those experimental changes may prove unsuitable for shipment even though the ensuing product passes qualification tests 98. For that reason, the non-qualified, or experimental product remains in the staging area 104 until the manufacturer releases that product, or changes the product status to a "qualified" product. Once qualified at step 106, product in staging area 104 will pass to shipment 102. It may be necessary to periodically perform qualification tests 98 to determine if product in the staging area qualifies or not.

If the shipped product is that which contains memory which is programmed by a customer after shipment, FIG. 4 illustrates a continuance of flow 70 to indicate customer programmability. In particular, shipment of hardware at step 102 places product in the hands of the customer or user (i.e., places the product in the field) at step 108. The product is merely hardware and is hopefully derived solely from qualified hardware revisions. The customer may then be called upon to program the hardware by receiving software shipped possibly from the manufacturer at step 110. Having both the hardware and software, the customer then programs the product step 112. After programming, the product will hopefully respond according to its intended application. However, if it does not, the customer can return the product from the field 108 back to the staging area 104, where the manufacturer can then ascertain from the stored PE bits what hardware and software revisions were programmed into the failed integrated circuit. Thus, read operation 100 is repeated on the failed product to determine if it received the appropriate software revision for the hardware revision shipped. For example, if the software revision were revision number three, and the read hardware revision was revision number four, then the part might fail in its intended use. The manufacturer must then forward to the customer an updated software revision at step 110. Shipping the new software revision four which matches product having hardware revision 4 will ensure not only compatibility but, more importantly, provide a viable product for use by the customer.

The customer can, according to one embodiment, read discrepancy at step 112 if the integrated circuit employs on-board mechanisms which compares the hardware and software revisions. If so, then the mechanism will indicate that an unfavorable comparison has occurred and will either inform the customer to cease programming the integrated circuit with the outdated software, or return the integrated circuit for an updated hardware revision. Thus, branch 114 indicates a customer informing the manufacturer that a new hardware or software revision must be shipped at steps 102 and 110, respectively.

Figure 5:
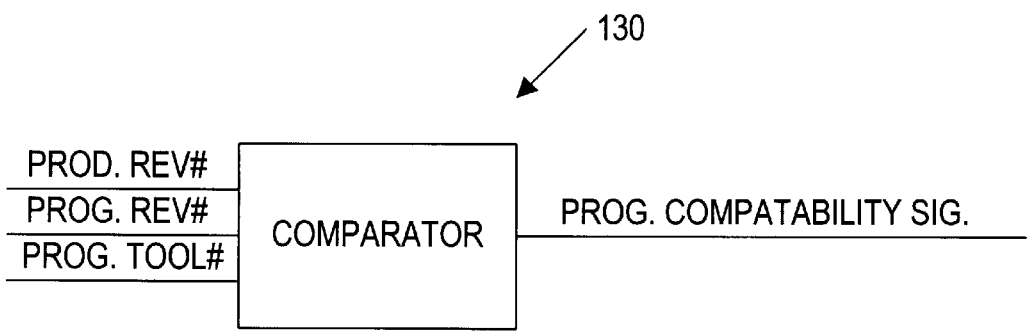
FIG. 5 is a plan view of comparator circuitry used to determine compatibility between the shipped hardware and the program software.

Referring to FIG. 5, a mechanism 120 is shown which can advise the programmer or end user to stop programming if revision history incompatibility occurs. Contained within software of the tester or program or, alternatively, placed upon the integrated circuit, is a comparator mechanism 130 which receives the product (hardware) revision number, the program (software) revision number and possibly the programming tool number previously programmed as PE bits into the storage location. Thus, the PE bits indicating the hardware and software revision numbers and the programming tool number are compared to determine if the software revision is compatible with the present hardware revision used to form the integrated circuit, or vice versa. Similarly, comparator 130 determines if the programmer who is programming the integrated circuit is using the correct programming tool. It is known that there may be numerous programming tools used to program an electrically alterable integrated circuit. Even though the programming tools may use the same program, those tools may nonetheless provide differing results. It is those results which may cause eventual failure of the programmed product. For that reason, the programming tool must be known, along with the specific program revision used before it can be ascertained if the product has been properly programmed in accordance with the specific hardware revision being programmed. Accordingly, comparator 130 contains logic (i.e., logic gates) which receive the addressed revision numbers and tool numbers, and outputs a programmed compatibility signal if proper compatibility is achieved. If compatibility is not achieved, then the programmer will be notified during the programming operation that the particular software program is incompatible with the particular hardware being programmed. It is through the benefit of having the PE bits previously written into the integrated circuit, and the comparator which accesses those bits in a specified fashion that a user can be notified of incompatibility before further harming a possibly viable hardware product.

It will be appreciated to those skilled in the art having the benefit of this disclosure that the invention is believed applicable to any integrated circuit which can embody non-volatile storage elements. It is understood that the form of the invention shown is to be taken as exemplary, presently preferred embodiments. Regardless of how the integrated circuit is processed, or tested, or assembled, the present invention is suited for storing indicia on how, when and where the integrated circuit is manufactured, as well as how, when and where software is programmed into the integrated circuit. The combination of hardware and software revisions thusly programmed provides insights as to possible failures of the product at the customer site. Alternatively, information as to how, when and where hardware is derived proves beneficial in preventing shipment of that hardware if the hardware is not qualified for shipment. Accordingly, the specification and drawings are to be regarded in an illustrative rather than a restrictive sense as to possibly numerous variations which fall within the spirit and scope of the present invention.

What is claimed is:

1. An integrated circuit comprising a non-volatile storage element in an address location reserved for receiving information regarding suitability of the integrated circuit for shipment, wherein the information regarding suitability for shipment is independent of a performance of the integrated circuit in testing.

2. The integrated circuit as recited in claim 1, wherein said address location is inaccessible during normal operation of the integrated circuit.

3. The integrated circuit as recited in claim 1, wherein the information received by the storage element comprises at least one indicium as to a particular sequence of manufacturing steps used to produce the integrated circuit.

4. The integrated circuit as recited in claim 1, wherein the information received by the storage element comprises at least one layout indicium for the integrated circuit.

5. The integrated circuit as recited in claim 1, wherein the storage element receives the information prior to assembly of the integrated circuit in a package.

6. The integrated circuit as recited in claim 5, wherein said information comprises at least one product engineering bit.

7. The integrated circuit as recited in claim 6, wherein reading the product engineering bit containing the received information indicates the integrated circuit is inappropriate for shipment.

8. The integrated circuit as recited in claim 1, wherein said information identifies a hardware revision specific to the integrated circuit.

9. The integrated circuit as recited in claim 8, wherein said hardware revision comprises a revision to a processing recipe, processing tool or layout specific to the integrated circuit.

10. The integrated circuit as recited in claim 1, wherein said information identifies a software revision specific to the integrated circuit.

11. The integrated circuit as recited in claim 10, wherein said software revision comprises a particular version of software used to program memory elements of the integrated circuit.

12. An apparatus for determining if an integrated circuit is qualified for release from an integrated circuit manufacturer, comprising:

a programming mechanism adapted for writing at least one bit of information into at least one storage element on the integrated circuit, wherein the information indicates one or more manufacturing, programming and/or testing process steps and/or parameters for the integrated circuit and is traceable to a particular wafer and wafer lot; and a reading mechanism adapted for reading the programmed information from the storage element to determine if the integrated circuit is qualified for release, wherein an indication of release qualification given by the programmed information is independent of a performance of the integrated circuit in testing.

13. The apparatus as recited in claim 12, wherein said information is written into said at least one storage element prior to encapsulating the integrated circuit in a package.

14. The apparatus as recited in claim 12, wherein said information comprises an integrated circuit processing sequence identifier.

15. The apparatus as recited in claim 12, wherein said information comprises an integrated circuit layout identifier.

16. The apparatus as recited in claim 12, wherein said programming mechanism comprises a signal generator operably coupled to an address and data interface.

17. The apparatus as recited in claim 16, wherein the address and data interface is adapted to receive encoded bits representing a revision number for identifying a manufacturing process used to produce the integrated circuit.

18. The apparatus as recited in claim 12, wherein the information indicates whether the integrated circuit is from an experimental wafer or is unqualified for release or shipment.

* * * * *